(12) United States Patent
Li et al.

(10) Patent No.: US 10,748,946 B2
(45) Date of Patent: Aug. 18, 2020

(54) LENS MODULE

(71) Applicant: TRIPLE WIN TECHNOLOGY(SHENZHEN) CO. LTD., Shenzhen (CN)

(72) Inventors: Yu-Shuai Li, Shenzhen (CN); Shin-Wen Chen, New Taipei (TW); Kun Li, Shenzhen (CN); Ke-Hua Fan, Shenzhen (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 32 days.

(21) Appl. No.: 16/222,012

(22) Filed: Dec. 17, 2018

(65) Prior Publication Data

US 2020/0135778 A1 Apr. 30, 2020

(30) Foreign Application Priority Data

Oct. 29, 2018 (CN) .......................... 2018 1 1271555

(51) Int. Cl.
| | |
|---|---|
| *H04N 5/225* | (2006.01) |
| *H01L 27/146* | (2006.01) |
| *H05K 1/02* | (2006.01) |
| *H04N 5/335* | (2011.01) |

(52) U.S. Cl.
CPC ..... *H01L 27/14601* (2013.01); *H04N 5/2253* (2013.01); *H04N 5/2254* (2013.01); *H04N 5/335* (2013.01); *H05K 1/0274* (2013.01)

(58) Field of Classification Search
CPC ...... H04N 5/23212; G02B 7/08; G02B 7/102; G02B 7/36; G03B 3/00; G03B 3/10
See application file for complete search history.

(56) References Cited

U.S. PATENT DOCUMENTS

| | | | |
|---|---|---|---|
| 2008/0279547 A1* | 11/2008 | Wu ........................ | G03B 17/00 396/529 |
| 2009/0225451 A1* | 9/2009 | Chiang .................. | G02B 7/023 359/823 |
| 2014/0048997 A1* | 2/2014 | Cheng .................. | H04N 5/2257 269/303 |
| 2015/0021730 A1* | 1/2015 | Chen ................. | H01L 27/14627 257/432 |
| 2017/0155807 A1 | 6/2017 | Zhang et al. | |

(Continued)

FOREIGN PATENT DOCUMENTS

| | | |
|---|---|---|
| CN | 204180154 | 2/2015 |
| CN | 105472218 | 4/2016 |

*Primary Examiner* — Kelly L Jerabek
(74) *Attorney, Agent, or Firm* — ScienBiziP, P.C.

(57) ABSTRACT

A lens module includes a circuit board, a hollow mounting bracket, a photosensitive chip, a lens base, and a lens. The photosensitive chip is mounted within the hollow mounting bracket on a surface of the circuit board. The lens base is mounted on a surface of the mounting bracket opposite to the circuit board. The lens base axially defines a through hole. The lens is mounted within the lens base. The lens base includes a screw thread formed along an inner wall of the through hole. The lens includes mating threads formed along a periphery of the lens contacting the inner wall of the through hole. The mating threads define at least one thread slot which defines a gap with the screw threads of the inner wall of the through hole.

9 Claims, 4 Drawing Sheets

(56) References Cited

U.S. PATENT DOCUMENTS

2017/0310861 A1\* 10/2017 Wang .................... H04N 5/2254
2019/0141224 A1\* 5/2019 Park ..................... H04N 5/2254
2019/0235267 A1\* 8/2019 Minamisawa ........... G02B 7/08
2020/0084348 A1\* 3/2020 Zhang ................. H04N 5/2254

\* cited by examiner

LENS MODULE

FIELD

The subject matter herein generally relates to lens modules, and more particularly to a lens module of an electronic device.

BACKGROUND

Generally, electronic devices, such as mobile phones, include cameras. The cameras use lens modules to capture images. During operation of the camera, humidity or condensation may form water vapor within the lens module, thereby affecting performance of the lens module.

BRIEF DESCRIPTION OF THE DRAWINGS

Implementations of the present disclosure will now be described, by way of embodiments, with reference to the attached figures.

DETAILED DESCRIPTION

Figure 1:
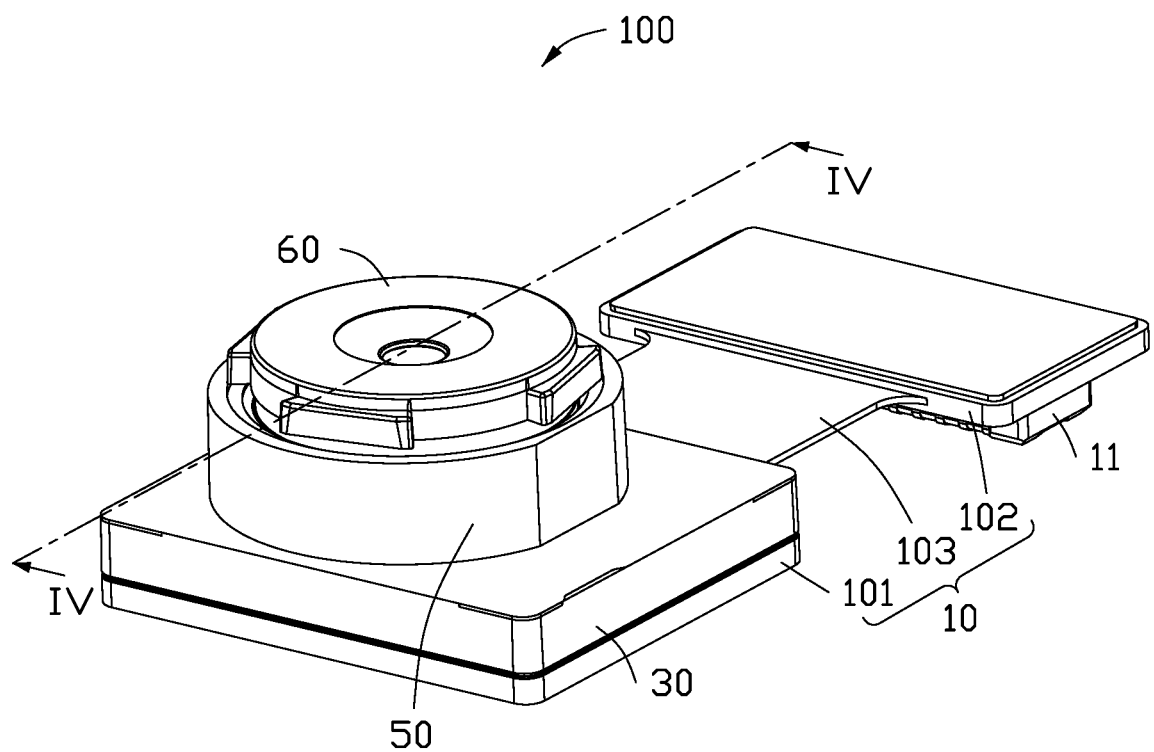
FIG. 1 is an assembled, isometric view of an embodiment of a lens module.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasable connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
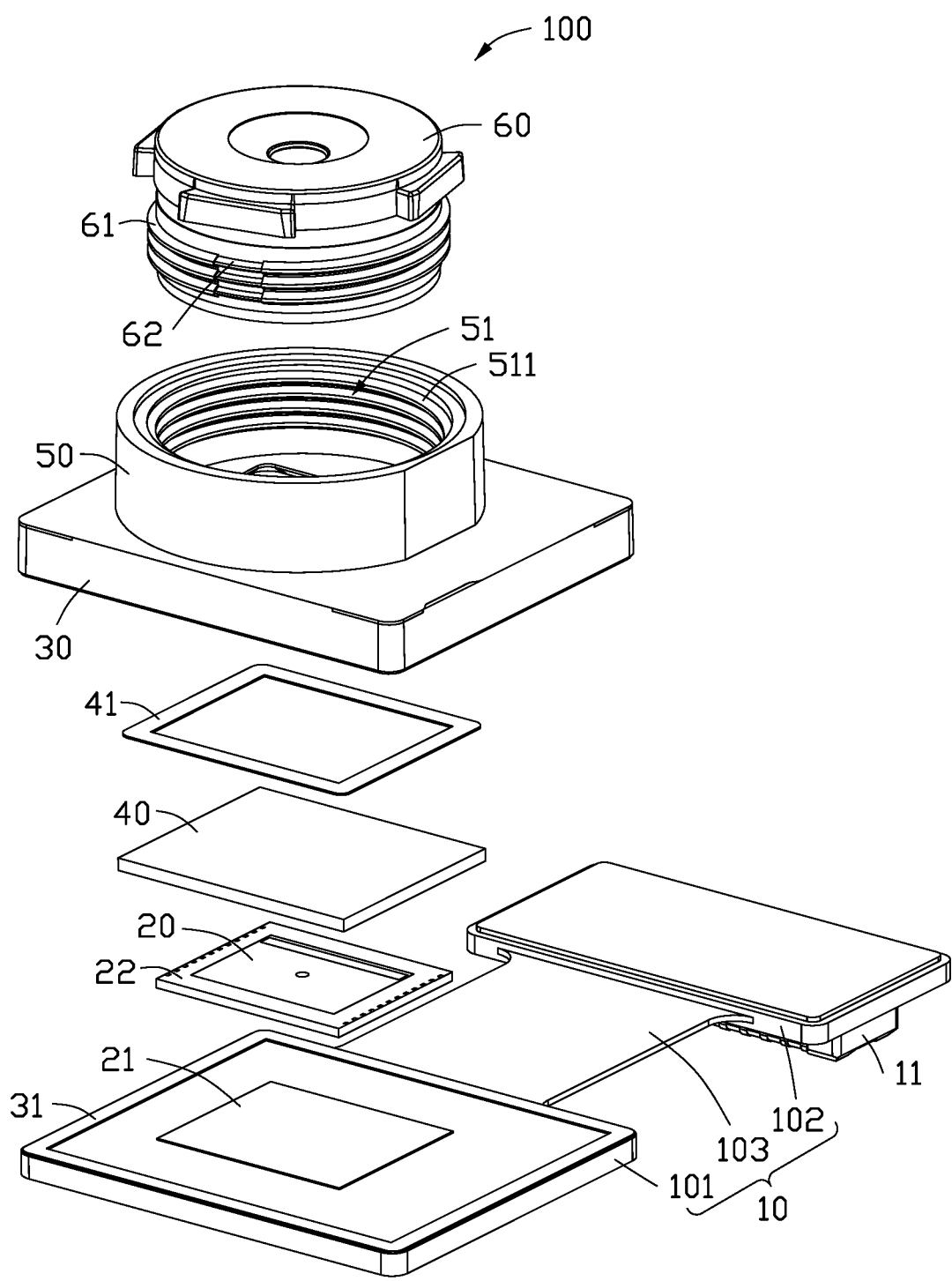
FIG. 2 is an exploded, view of the lens module in FIG. 1.
Figure 3:
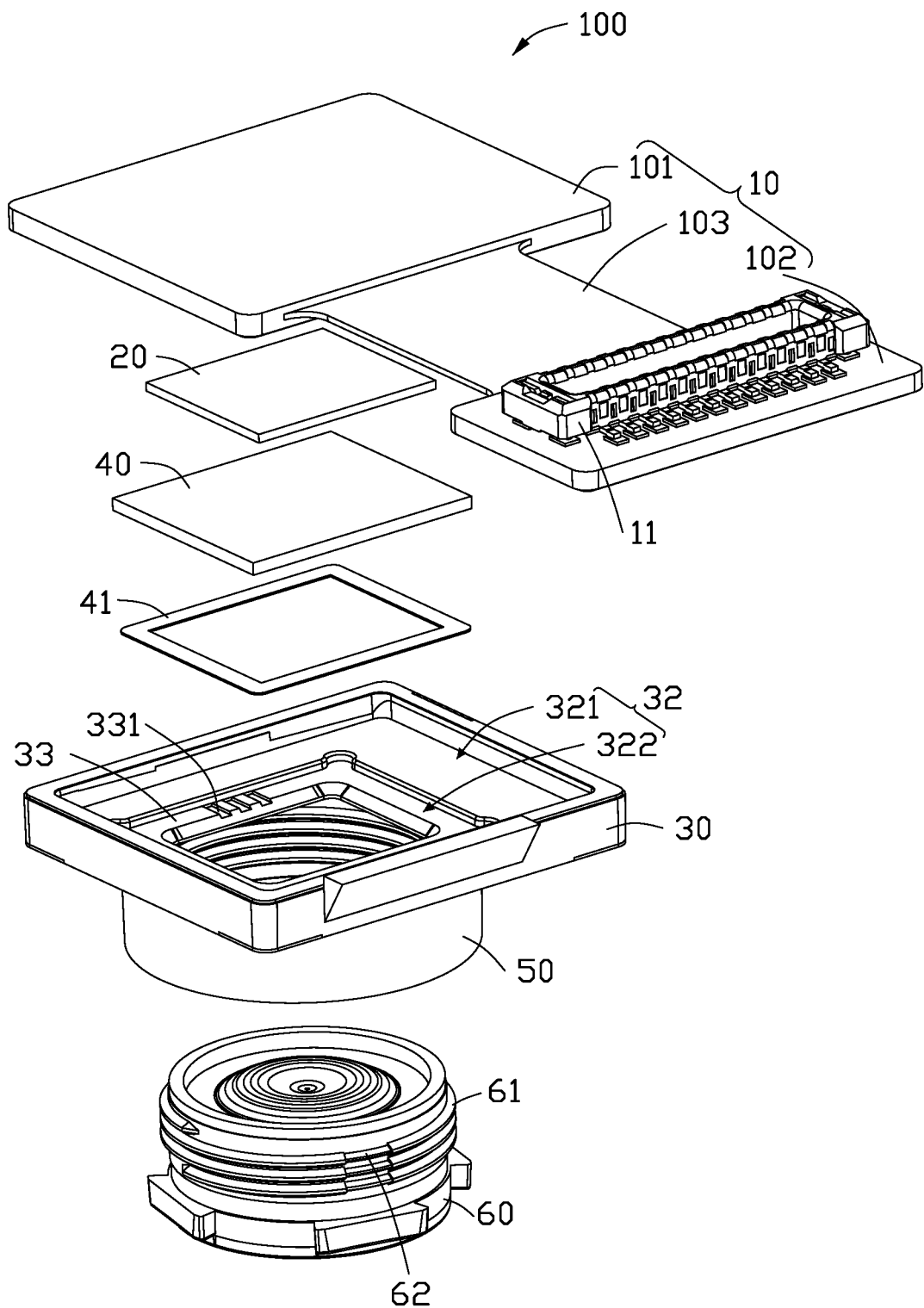
FIG. 3 is similar to FIG. 2 showing the lens module from another angle.

FIGS. 1-3 show an embodiment of a lens module 100 of an electronic device (not shown). The electronic device may be a smart phone or a tablet computer, for example. The lens module 100 includes a circuit board 10, a photosensitive chip 20, a hollow mounting bracket 30, a light filter 40, a lens base 50, and a lens 60.

The photosensitive chip 20 is mounted to a surface of the circuit board 10 by a first adhesive layer 21. In one embodiment, the first adhesive layer 21 is a similar size to the photosensitive chip 20. The first adhesive layer 21 is made of black adhesive or an optical adhesive. The circuit board 10 is a ceramic substrate, flexible board, hard board, or flexible-hard composite board. In one embodiment, the circuit board 10 is a flexible-hard composite board including a first hard portion 101, a second hard portion 102, and a flexible portion 103. The flexible portion 103 is coupled between the first hard portion 101 and the second hard portion 102. The photosensitive chip 20 is mounted to the first hard portion 101. Specifically, the first hard portion 101 includes a plurality of electrical components (not shown) and a plurality of gold fingers (not shown). The electronic components may surround the photosensitive chip 20. The photosensitive chip 20 includes a metal lead 22 on a surface of the photosensitive chip 20. The metal lead 22 electrically couples to the gold fingers. In one embodiment, the photosensitive chip 20 is a complementary metal oxide semiconductor chip or a charge-coupled device chip. The metal lead 22 is made of highly conductive metal material, such as gold. The electronic components may be resistors, capacitors, diodes, triodes, relays, an electrically-erasable programmable read-only memory, or the like.

The second hard portion 102 includes an electric coupling component 11. The electric coupling component 11 is arranged on a side of the circuit board 10 opposite to the electronic components and the gold fingers. The electric coupling component 11 may be a connector or a gold finger.

The mounting bracket 30 is mounted to the circuit board 10 by a hollow second adhesive layer 31. In one embodiment, the mounting bracket 30 is substantially rectangular and defines an accommodating space 32 therethrough. A width of the accommodating space 32 is greater than a width of the photosensitive chip 20. The photosensitive chip 20 is received within the accommodating space 32. In one embodiment, the second adhesive layer 31 is made of an optical adhesive.

The light filter 40 is mounted to the mounting bracket 30 by a hollow third adhesive layer 41. The light filter 40 is aligned with the light filter 20, such that the light filter 40 and the circuit board 10 cover opposite sides of the accommodating space 32.

Figure 4:
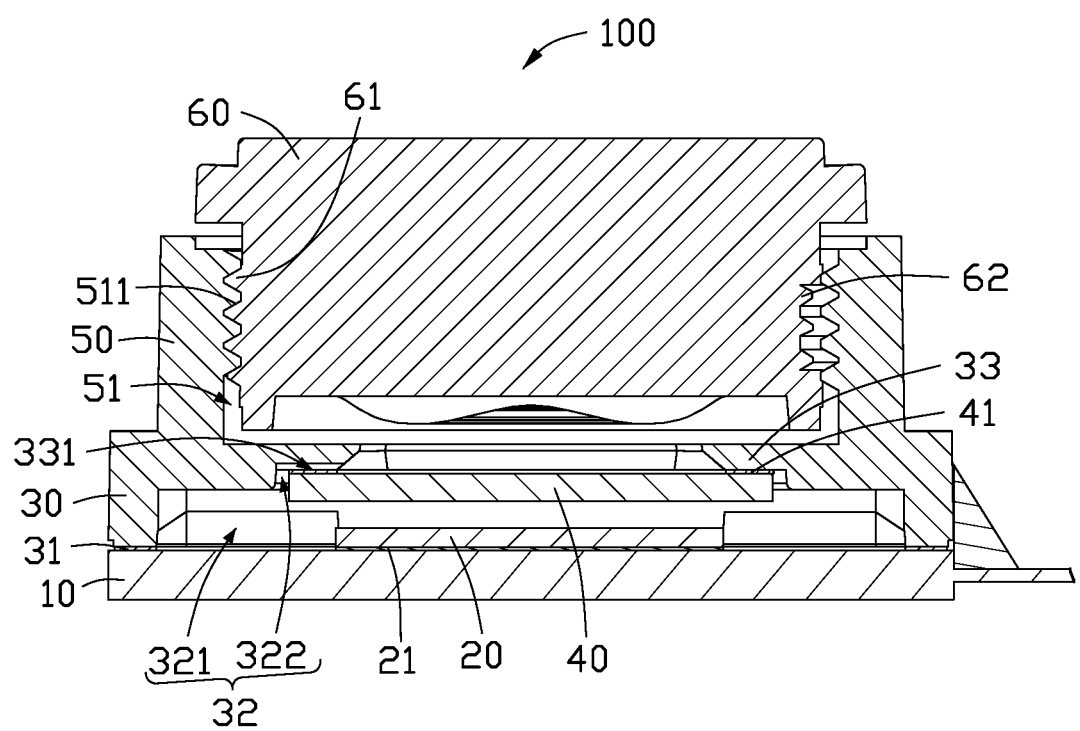
FIG. 4 is a cross-sectional diagram of the lens module taken along line IV-IV in FIG. 1.

As shown in FIG. 4, in one embodiment, the accommodating space 32 is a stepped hole. The accommodating space 32 includes a first recessed area 321 and a second recessed area 322. A width of the first recessed area 321 is greater than a width of the first recessed area 322. A flange 33 protrudes within the accommodating space 32 and surrounds an axis of the accommodating space 32. The photosensitive chip 20 is received within the first recessed area 321. The light filter 40 is mounted on the flange 33 by the third adhesive layer 41 within the second recessed area 322. In another embodiment, the flange 33 is formed between the first recessed area 321 and the second recessed area 322.

In one embodiment, the third adhesive layer 41 is made of an optical adhesive. The light filter 40 is an IR-cut filter. The IR-cut filter is an optical substrate having high-refractive index optical films coated thereon to filter out infrared light.

The flange 33 defines at least one flange slot 331 which defines a gap with the light filter 40 when the light filter 40 is mounted on the flange 33 by the third adhesive layer 41. Thus, the flange slot 331 prevents the third adhesive layer 41 and the light filter 40 from fully sealing the accommodating space 32. In one embodiment, the flange slot 331 is strip-shaped.

The lens base 50 is mounted to a surface of the mounting bracket 30 away from the circuit board 10. In one embodiment, the lens base 50 is integrally formed with the mounting bracket 30. In other embodiments, the lens base 50 is mounted to the mounting bracket 30 by an adhesive.

The lens base 50 is substantially round and columnar and defines a through hole 51. The through hole 51 is aligned with the accommodating space 32. The lens base 50 includes a plurality of screw threads 511 formed along an inner wall of the through hole 51.

The lens 60 is mounted within the through hole 51 of the lens base 50. The lens 60 faces the photosensitive chip 20. The lens 60 includes a plurality of mating threads 61 formed along an outer periphery of lens 60. The lens 60 is screwed into the through hole 51 by engagement between the screw threads 511 and the mating threads 61. The mating threads 61 define at least one thread slot 62. A gap is defined between with the screw threads 511 and the at least one thread slot 62. Thus, the lens 60 does not completely seal the through hole 51. The at least one thread slot 62 extends along an axial direction of the lens 60. Thus, the at least one flange slot 331 and the at least one thread slot 62 are crisscrossed.

In one embodiment, the lens base 50 may be a voice coil motor or a bracket. The lens 60 may be made of resin.

In operation, the light filter 40 filters out the infrared light, and the filtered light passed through the light filter 40 is received by the photosensitive chip 20. The photosensitive chip converts the light into electrical signals. The electrical signals are sent through the metal lead 22 to the circuit board 10. Thus, the circuit board 10 can process the electrical signals to obtain an image captured by the lens 60. The electric coupling component 11 is electrically coupled to other electrical components of the electronic device.

Because the flange 33 defines the at least one flange slot 331 and the lens 60 defines the at least one thread slot 62, water vapor or condensation formed during operation of the camera module 100 can escape easily, thereby improving operation of the lens module 100. Also, because the flange slot 331 is crisscrossed with the thread slot 62, dust and debris is not able to enter into the lens module 100 easily. Furthermore, a size of the thread slot 62 can be adjusted during manufacture to adjust a torque tension between the lens 60 and the lens base 50.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A lens module comprising:
   a circuit board;
   a mounting bracket which is hollow, wherein the mounting bracket defines an accommodating space, a flange protrudes within the accommodating space and surrounding an axis of the accommodating space;
   a light filter mounted on the flange within the accommodating space, wherein the flange defines at least one flange slot, a first gap is defined between the light filter and the at least one flange slot;
   a photosensitive chip mounted within the mounting bracket on a surface of the circuit board;
   a lens base mounted on a surface of the mounting bracket opposite to the circuit board, the lens base axially defining a through hole; and
   a lens mounted within the lens base; wherein:
   the lens base comprises screw thread formed along an inner wall of the through hole;
   the lens comprises mating threads formed along a periphery of the lens contacting the inner wall of the through hole;
   the mating threads define at least one thread slot, the at least one thread slot extends along an axial direction of the lens, the at least one thread slot and the at least one flange slot are crisscrossed, a second gap is defined between the screw threads on the inner wall of the through hole and the at least one thread slot.

2. The lens module of claim 1, wherein:
   the accommodating space is stepped hole comprising a first recessed area and a second recessed area;
   the second recessed area is recessed within the first recessed area;
   the flange is formed within the second recessed area;
   the photosensitive chip is received within the first recessed area; and
   the light filter is mounted on the flange and received within the second recessed area.

3. The lens module of claim 1, wherein the light filter is an IR-cut filter.

4. The lens module of claim 1, wherein:
   the circuit board is a flexible-hard composite board comprising a first hard portion, a second hard portion, and a flexible portion;
   the flexible portion is coupled between the first hard portion and the second hard portion; and
   the photosensitive chip is mounted to the first hard portion.

5. The lens module of claim 4, wherein:
   the photosensitive chip comprises a metal lead surrounding a periphery of a surface of the photosensitive chip;
   the metal lead is electrically coupled to a plurality of gold fingers of the first hard portion; and
   the second hard portion comprises an electric coupling component.

6. The lens module of claim 1, wherein the photosensitive chip is a complementary metal oxide semiconductor chip.

7. The lens module of claim 1, wherein the lens base is a voice coil motor or a bracket.

8. The lens module of claim 1, wherein the lens is made of resin.

9. The lens module of claim 1 further comprising a first adhesive layer mounting the photosensitive chip to the circuit board.

* * * * *